United States Patent
Yoon et al.

(10) Patent No.: US 12,362,757 B2
(45) Date of Patent: Jul. 15, 2025

(54) DETERMINING QUANTIZATION STEP SIZE FOR CROSSBAR ARRAYS

(71) Applicant: SAMSUNG ELECTRONICS CO., LTD., Suwon-si (KR)

(72) Inventors: Seungkeun Yoon, Suwon-si (KR); Seijoon Kim, Suwon-si (KR); Hyunsoo Kim, Suwon-si (KR); Chang-Woo Shin, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 255 days.

(21) Appl. No.: 18/300,692

(22) Filed: Apr. 14, 2023

(65) Prior Publication Data

US 2024/0154618 A1 May 9, 2024

(30) Foreign Application Priority Data

Nov. 4, 2022 (KR) .................. 10-2022-0146050

(51) Int. Cl.
| | |
|---|---|
| *H03M 1/06* | (2006.01) |
| *G06F 7/544* | (2006.01) |
| *G06N 3/04* | (2023.01) |
| *G06N 3/063* | (2023.01) |
| *G06N 3/065* | (2023.01) |
| *G06N 3/08* | (2023.01) |

(Continued)

(52) U.S. Cl.
CPC ........ *H03M 1/0648* (2013.01); *G06F 7/5443* (2013.01); *G06N 3/04* (2013.01);
(Continued)

(58) Field of Classification Search
CPC .... H03M 1/0648; H03M 1/125; H03M 1/462; G06N 3/04; G06N 3/063; G06N 3/08; G06N 3/065; G06F 7/5443
(Continued)

(56) References Cited

U.S. PATENT DOCUMENTS

| | | | | |
|---|---|---|---|---|
| 11,114,158 | B1 * | 9/2021 | Ge | .............. G11C 7/16 |
| 11,539,370 | B2 * | 12/2022 | Ge | .............. G11C 7/16 |

(Continued)

OTHER PUBLICATIONS

Banner, Ron, et al. "Post training 4-bit quantization of convolutional networks for rapid-deployment." *Advances in Neural Information Processing Systems* vol. 32 (2019). pp 1-9.

(Continued)

*Primary Examiner* — Khai M Nguyen
(74) *Attorney, Agent, or Firm* — NSIP Law

(57) ABSTRACT

A method of optimizing a quantization step size of an analog-to-digital converter (ADC) based on a number of crossbar arrays of a computing device includes: generating a first mapping relationship between the quantization step size of the ADC and a first root mean square error, the first root mean square error reflecting a quantization error and a clipping error, wherein the generating the first graph is based on use of only a single crossbar array; generating a second mapping relationship between the quantization step size of the ADC and a second root mean square error, the second root mean square error reflecting a quantization error, wherein the generating the second mapping is based on a uniform distribution of a total sum of quantization errors; and determining the quantization step size of the ADC based on the first mapping relationship and the second mapping relationship.

20 Claims, 8 Drawing Sheets

(51) Int. Cl.
  *H03M 1/12* (2006.01)
  *H03M 1/46* (2006.01)
(52) U.S. Cl.
  CPC .............. *G06N 3/063* (2013.01); *G06N 3/065* (2023.01); *G06N 3/08* (2013.01); *H03M 1/125* (2013.01); *H03M 1/462* (2013.01)
(58) Field of Classification Search
  USPC ........................................................ 341/155
  See application file for complete search history.

(56) References Cited

U.S. PATENT DOCUMENTS

2014/0301413 A1  10/2014  Ling
2022/0036185 A1  2/2022   Dronen et al.

OTHER PUBLICATIONS

Vogel, Sebastian, et al. "Self-supervised quantization of pre-trained neural networks for multiplierless acceleration." *2019 Design, Automation & Test in Europe Conference & Exhibition (DATE)*. IEEE, (2019). pp 1094-1099.

Shin, Sungho, et al. "Fixed-point optimization of deep neural networks with adaptive step size retraining." *2017 IEEE International conference on acoustics, speech and signal processing (ICASSP)*. IEEE, (2017). pp 1-5.

Kim, Choongmin, et al. "A Neural Network Decomposition Algorithm for Mapping on Crossbar-Based Computing Systems." *Electronics* vol. 9. Issue 9 (2020): 1526. pp 1-10.

* cited by examiner $o_l = \sum i_k w_{kl}$

DETERMINING QUANTIZATION STEP SIZE FOR CROSSBAR ARRAYS

CROSS-REFERENCE TO RELATED APPLICATIONS

This application claims the benefit under 35 USC § 119(a) of Korean Patent Application No. 10-2022-0146050, filed on Nov. 4, 2022, in the Korean Intellectual Property Office, the entire disclosure of which is incorporated herein by reference for all purposes.

BACKGROUND

1. Field

The following description relates to a computing device for determining a quantization step size for optimization of a neural network based on multiple crossbar arrays and an operating method thereof.

2. Description of Related Art

A vector matrix multiplication operation, also known as a multiply-accumulate (MAC) operation, may be implemented with a crossbar array. For example, when an input signal is applied to a neural network including multiple layers (e.g., an input layer, a hidden layer, and an output layer), a MAC operation may be performed for each layer. An input signal for a neural network may form an input vector, which may be data of images, byte streams, or other data sets. An input signal of a given layer may be multiplied by a weight of the given layer, and an output vector of the given layer may be a result of accumulated MAC operations. The output vector of the given layer may be an input vector for a subsequent layer. When a MAC operation in a layer is implemented with a crossbar array, a digital input signal may be converted into an analog signal by a digital-to-analog converter and the analog input signal may be input to the crossbar array. The output signal generated by the crossbar array may be converted into a digital signal by an analog-to-digital converter; the digital signal may be finally outputted. In this case, the value of the outputted digital signal may differ from an actual value corresponding to analog signal. Such a difference is usually referred to as a quantization error and a clipping error.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of optimizing a quantization step size of an analog-to-digital converter (ADC) based on a number of crossbar arrays of a computing device includes: generating a first mapping relationship between the quantization step size of the ADC and a first root mean square error, the first root mean square error reflecting a quantization error and a clipping error, wherein the generating the first graph is based on use of only a single crossbar array; generating a second mapping relationship between the quantization step size of the ADC and a second root mean square error, the second root mean square error reflecting a quantization error, wherein the generating the second mapping is based on a uniform distribution of a total sum of quantization errors; and determining the quantization step size of the ADC based on the first mapping relationship and the second mapping relationship.

The computing device may include the crossbar arrays and the crossbar arrays may perform a multiply and accumulate (MAC) operation for a layer in a neural network.

The generating the first mapping relationship may include, for each of the crossbar arrays of the computing device, generating the first mapping relationship based on calculation of a first root mean square error for a quantized output value obtained by inputting, to an ADC, a signal obtained by summing analog signals respectively output from corresponding column lines of the crossbar array.

The generating the first mapping relationship may include calculating the first root mean square error based on the quantization step size of the ADC, an output standard deviation of a single crossbar array, an output mean of the single crossbar array, and a number of bits outputted by the ADC.

The generating the second mapping relationship may include calculating the second root mean square error based on the quantization step size of the ADC and the number of crossbar arrays of the computing device.

The generating the second mapping relationship may include calculating the second mapping relationship by a linear function of which a slope is a square root of a value obtained by dividing the number of crossbar arrays included in the computing device by 12.

The quantization step size of the ADC may be determined based on an intersection point of the calculated first mapping relationship and the calculated second mapping relationship.

As the number of crossbar arrays of the computing device increases, the determined quantization step size of the ADC may increase.

The method may further include, for an ADC quantizing an analog signal output by a column line of a crossbar array included in the computing device, adding a number of bits to the ADC to express numbers after a decimal point of a quantized output value that is output by the ADC, and changing the quantization step size of the ADC based on the number of bits added to the ADC.

The changing of the quantization step size of the ADC may include: calculating a third mapping relationship between the quantization step size of the ADC and the second root mean square error by calculating the second root mean square error based on the quantization step size of the ADC, the number of crossbar arrays included in the computing device, and the number of bits added to the ADC; and changing the quantization step size of the ADC based on the first mapping relationship and the third mapping relationship.

The third mapping relationship may correspond to a linear function and may differ from the calculated second graph.

In one general aspect, a computing device includes: crossbar arrays; analog-to-digital converters (ADCs) respectively connected to column lines of the plurality of crossbar arrays; and a processor configured to: generate a first mapping relationship between a quantization step size of an ADC and a first root mean square error, wherein the first root mean square error reflects a quantization error and a clipping error, and wherein the generating the first mapping relationship is based on use of a single crossbar array, generate a second mapping relationship between the quantization step size of the ADC and a second root mean square error, wherein the second root mean square error reflects a quantization error, and wherein the generating the second mapping relationship is based on a uniform distribution of a total sum of quantization errors, and determine the quantization step size of the ADC based on the first mapping relationship and the second mapping relationship.

The computing device may be configured to use the crossbar arrays to perform a multiply and accumulate (MAC) operation in a layer of a neural network.

The processor may be further configured to, for each of the crossbar arrays, calculate the first mapping relationship based on calculation of a first root mean square error for a quantized output value obtained by inputting, to an ADC, a signal obtained by summing analog signals respectively output from corresponding column lines of the crossbar arrays.

The processor may be further configured to calculate the first root mean square error based on the quantization step size of the ADC, an output standard deviation of the single crossbar array, an output mean of the single crossbar array, and a number of bits used for the ADC.

The processor may be further configured to calculate the second root mean square error based on the quantization step size of the ADC and a number of crossbar arrays of the computing device.

The processor may be further configured to calculate the second mapping relationship by a linear function of which a slope is a square root of a value obtained by dividing the number of crossbar arrays of the computing device by 12.

The processor may be further configured to determine the quantization step size of the ADC by a quantization step size corresponding to an intersection point of the first mapping relationship and the second mapping relationship.

As the number of crossbar arrays of the computing device increases, the determined quantization step size of the ADC may increase.

The processor may be further configured to, for an ADC quantizing an analog signal output by a column line of a crossbar array of the computing device, add a number of bits to the ADC to express numbers after a decimal point of a quantized output value that is output by the ADC, and change the quantization step size of the ADC based on the number of bits added to the ADC.

Other features and aspects will be apparent from the following detailed description, the drawings, and the claims.

Figure 1:
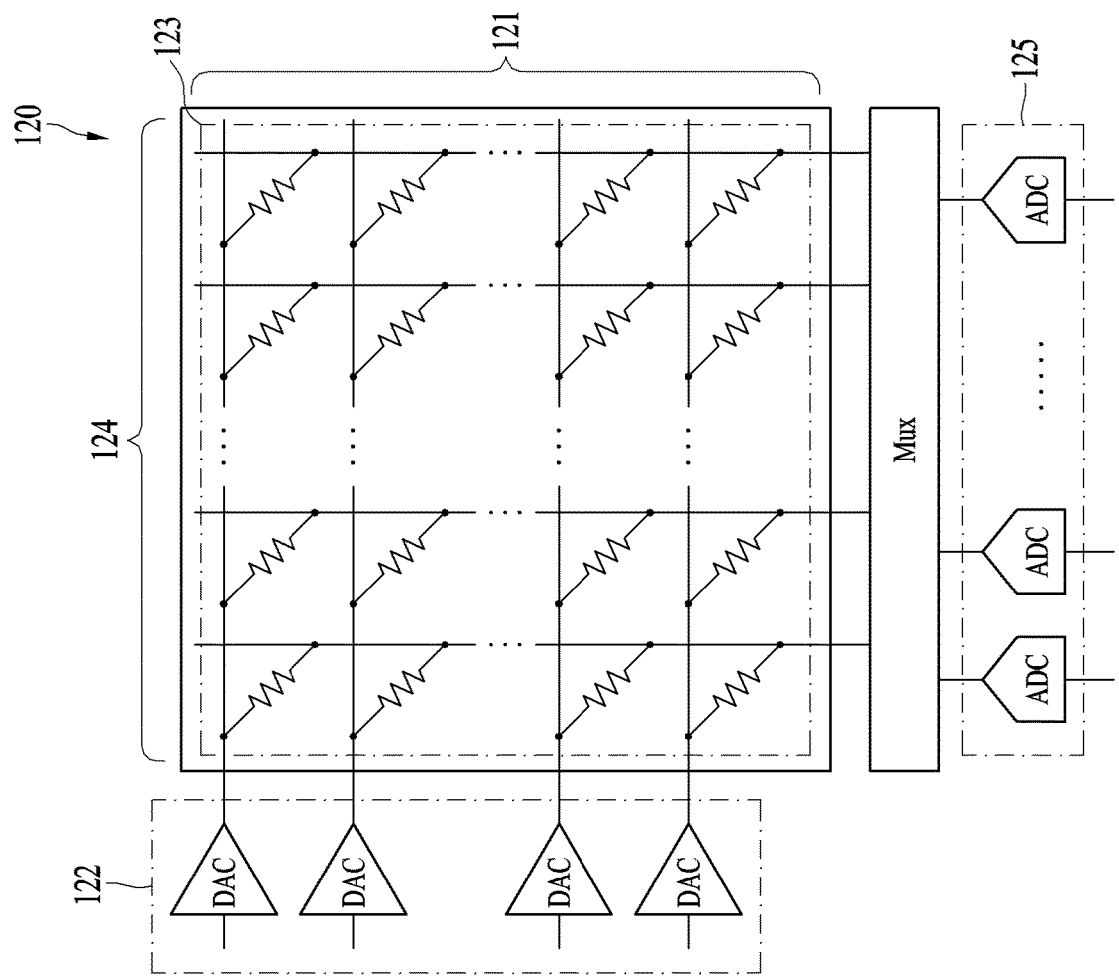
FIG. 1 illustrates an example of an in-memory computing circuit, according to one or more embodiments.
Figure 1:
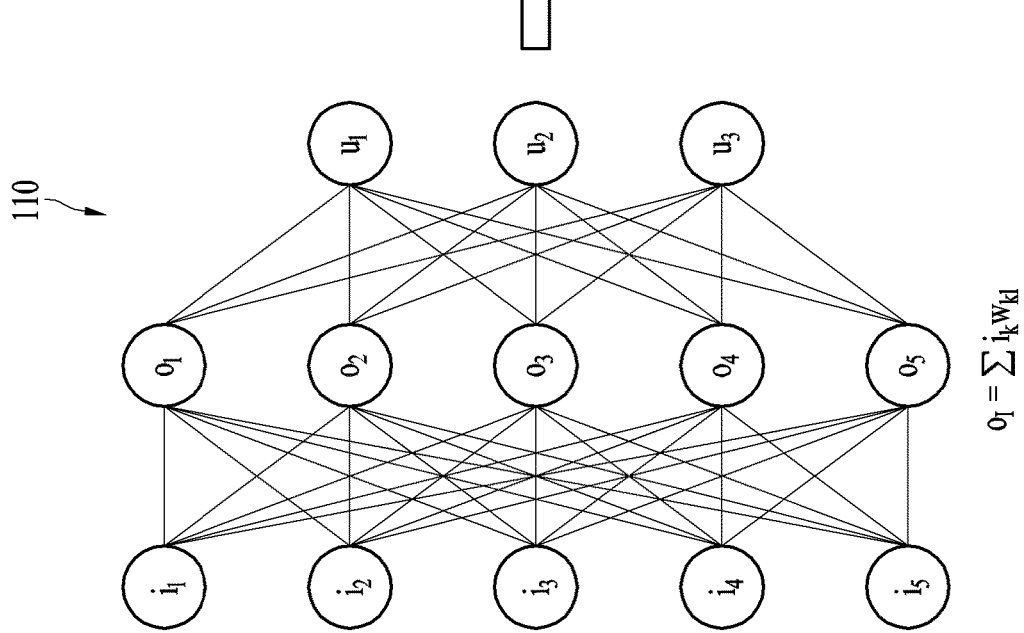

Throughout the drawings and the detailed description, unless otherwise described or provided, the same or like drawing reference numerals will be understood to refer to the same or like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only and is not to be used to limit the disclosure. The articles "a," "an," and "the" are intended to include the plural forms as well, unless the context clearly indicates otherwise. As used herein, the term "and/or" includes any one and any combination of any two or more of the associated listed items. As non-limiting examples, terms "comprise" or "comprises," "include" or "includes," and "have" or "has" specify the presence of stated features, numbers, operations, members, elements, and/or combinations thereof, but do not preclude the presence or addition of one or more other features, numbers, operations, members, elements, and/or combinations thereof.

Throughout the specification, when a component or element is described as being "connected to," "coupled to," or "joined to" another component or element, it may be directly "connected to," "coupled to," or "joined to" the other component or element, or there may reasonably be one or more other components or elements intervening therebetween. When a component or element is described as being "directly connected to," "directly coupled to," or "directly joined to" another component or element, there can be no other elements intervening therebetween. Likewise, expressions, for example, "between" and "immediately between" and "adjacent to" and "immediately adjacent to" may also be construed as described in the foregoing.

Although terms such as "first," "second," and "third", or A, B, (a), (b), and the like may be used herein to describe various members, components, regions, layers, or sections, these members, components, regions, layers, or sections are not to be limited by these terms. Each of these terminologies is not used to define an essence, order, or sequence of corresponding members, components, regions, layers, or sections, for example, but used merely to distinguish the corresponding members, components, regions, layers, or sections from other members, components, regions, layers, or sections. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment, e.g., as to what an example or embodiment may include or implement, means that at least one example or embodiment exists where such a feature is included or implemented, while all examples are not limited thereto.

FIG. 1 illustrates an example of an in-memory computing circuit, according to one or more embodiments.

In the example of FIG. 1, illustrated are a neural network 110 and an in-memory computing circuit (or simply an IMC circuit or macro).

A computing device in an example may process a neural network 110 (e.g., an artificial neural network) through in-memory computing. The neural network 110 may include one or more layers (e.g., an input layer, a hidden layer, and an output layer). For example, the input layer and the output layer may be configured in one layer and a hidden layer may be configured in one or more layers. Each layer may include a plurality of nodes. The plurality of nodes may be connected to nodes of a subsequent layer, and a weight may be set for each connection. For example, an output $o_1$ of one node may be determined based on input values (e.g., $i_1$, $i_2$, $i_3$, $i_4$, and $i_5$) propagated from other nodes of a previous layer connected to the node and on weights $w_{11}$, $w_{21}$, $w_{31}$, $w_{41}$, and $w_{51}$ of connections to the node. An l-th output $o_l$ among L output values may be represented by Equation 1 shown below. In this example, L may be an integer greater than or equal to 1 and l may be an integer greater than or equal to 1 and less than or equal to L.

$$o_l = \Sigma i_k w_{kl}$$ Equation 1

In Equation 1, $i_k$ denotes a k-th input among P inputs and $w_{kl}$ denotes a weight set between the k-th input and the l-th output. P is an integer greater than or equal to 1 and k is an integer greater than or equal to 1 and less than or equal to P. In other words, an input and an output between the nodes in the neural network 110 may be expressed as a weighted sum between an input and a weight. The weighted sum is a multiplication operation and an iterative accumulation operation between a plurality of inputs and a plurality of weights, and may also be referred to as a multiply and accumulate (MAC) operation. A computing device performing a MAC operation may be referred to as a multiplier-accumulator, and a circuit in which a MAC operation is performed may be referred to as a MAC circuit or macro. In addition, since the MAC operation described above is performed using a memory to which a computing function is added, the circuit for performing a MAC operation may be referred to as an in-memory computing (IMC) circuit. In addition, a device or circuit performing an MAC operation may be simply referred to as a computing device.

The IMC circuit may be configured by a crossbar array performing a MAC operation based on a digital pulse. For example, the crossbar array 120 of FIG. 1 may perform a MAC operation for one layer. The crossbar array 120 may include row lines 121, digital-to-analog converters (DACs) 122, elements 123, column lines 124, and analog-to-digital converters (ADCs) 125.

Digital output values propagated from nodes of a previous layer may be input as input values to the respective DACs 122 of the crossbar array 120. Analog signals (e.g., pulses) converted by each of the DACs 122 may be input to the row lines 121, respectively. The elements 123 may be disposed at intersecting points of the row lines 121 and column lines 124. One element may be disposed at an intersecting point of a corresponding row line and a corresponding column line, and the action thereof may depend on a weight corresponding to the element. One element may be disposed at an intersection of a corresponding row line and a corresponding column line and may transmit a pulse, inputted to the corresponding row line, to the column line. One column line may output pulses transmitted by multiple input lines via the elements disposed on the column line. The ADCs 125 may convert pulses (analog signals) transmitted by the column lines 124 into digital signals, respectively, and output the converted digital signals.

An output value outputted by an ADC may have a quantization error and a clipping error, which may depend on a setting of the ADC. In other words, an output value outputted by one ADC may be partially different from an actual value of the converted analog signal input to the ADC, and such a difference may be described by a quantization error and a clipping error.

A quantization error is a difference between an actual value of an analog signal and a quantized (converted) output value when the actual value of the analog signal is between a maximum quantization value and a minimum quantization value, when the analog signal is converted into a digital signal in an ADC (i.e., the converted value is not clipped but differs from the actual value). A clipping error is a difference between the actual value and the quantized output value when the actual value is greater than a maximum quantization value or is less than a minimum quantization value when the analog signal is converted into a digital signal in an ADC (i.e., the converted value is either the minimum or maximum quantization value but the actual value of the analog signal was less than the minimum or greater than the maximum). The maximum quantization value is a maximum value of a quantized output value that can be output by an ADC based on the number of bits used for the ADC and a quantization step size set to the ADC. Similarly, the minimum quantization value is a minimum value of a quantized output value that can be output by an ADC based on the number of bits used for the ADC and a quantization step size set to the ADC.

Figure 2:
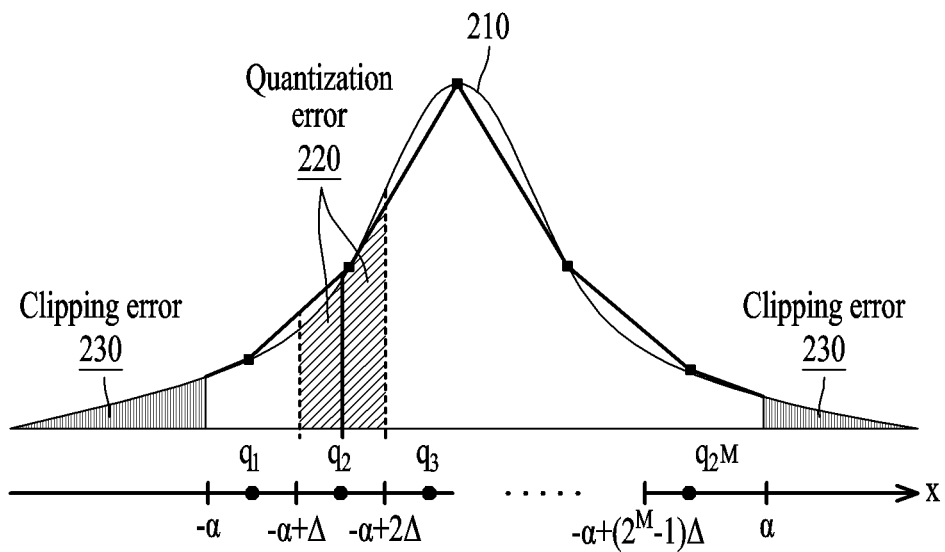
FIG. 2 illustrates an example of a quantization error and a clipping error for a distribution of multiply and accumulate (MAC) operations result values, according to one or more embodiments.

FIG. 2 illustrates an example of a quantization error and a clipping error for a distribution of MAC operation result values, according to one or more embodiments.

Referring to FIG. 2, result values (e.g., actual analog values) based on MAC operations may have a normal distribution, as shown in the graph 210. An ADC may receive an analog signal corresponding one result value and may convert the received analog signal into a digital signal corresponding to any one of $2^M$ possible quantized values (e.g., $q_1, q_2, \ldots, q_{2^M}$) based on the number of bits (e.g., M bits) outputted by the ADC.

Referring to FIG. 2, a quantization step size of an ADC is an amount (e.g., $\Delta$) between each of quantized values (e.g., $q_1, q_2, \ldots, q_{2^M}$) that may be output by the ADC (e.g., $\Delta$ is the difference between $q_2$ and $q_1$, from $q_3$ and $q_2$, etc.). Moreover, the maximum quantization value and the minimum quantization value of the ADC may be $-\alpha$ and $\alpha$, respectively. The ADC may output result values in the range of $-\alpha+\Delta$ to $\alpha+2\Delta$, i.e., values in the conversion range of $q_2$, by converting the analog result values in that range into the quantized value $q_2$, for example. In this case, differences between $q_2$ and each of the analog result values may be described by a quantization error 220. The quantization error 220 may be proportional to the quantization step size (e.g., $\Delta$). When the quantization step size increases, differences between quantized values may increase, and thus, the quantization error 220 increases. Conversely, when the quantization step size decreases, differences between quantized values decrease, and thus, the quantization error 220 decreases.

In another example, the ADC may convert result values less than $-\alpha$ into $q_1$ and result values greater than or equal to $+\alpha$ into quantized values $q_{2^M}$. In this case, (i) differences between $q_1$ and each of the result values less than $-\alpha$ and (ii) differences between $q_{2^M}$ and each of the result values greater than or equal to $+\alpha$ may be described by a clipping error 230.

When the quantization step size of the ADC decreases while the number of bits used for the ADC is fixed, the quantization error 220 may decrease as described above. However, because also a range between the maximum quantization value and the minimum quantization value necessarily decreases, the clipping error 230 may increase because the number of actual values out of the range between the maximum and minimum quantization values increases. On the other hand, when the quantization step size increases while the number of bits used for the ADC increases, the quantization error may increase. However, since a range between the maximum and minimum quantization values increases, the clipping error may decrease as number of actual values out of the range between the maximum quantization value and the minimum quantization value naturally decreases. The clipping error and the quantization error of an ADC may vary depending on the quantization step size of the ADC. Furthermore, as can be seen in FIG. 2, the magnitudes of quantization error and the clipping error may vary depending on a distribution of result values based on a MAC operation. While FIG. 2 shows a normal distribution of result values, in actual applications the distribution may vary.

Figure 3:
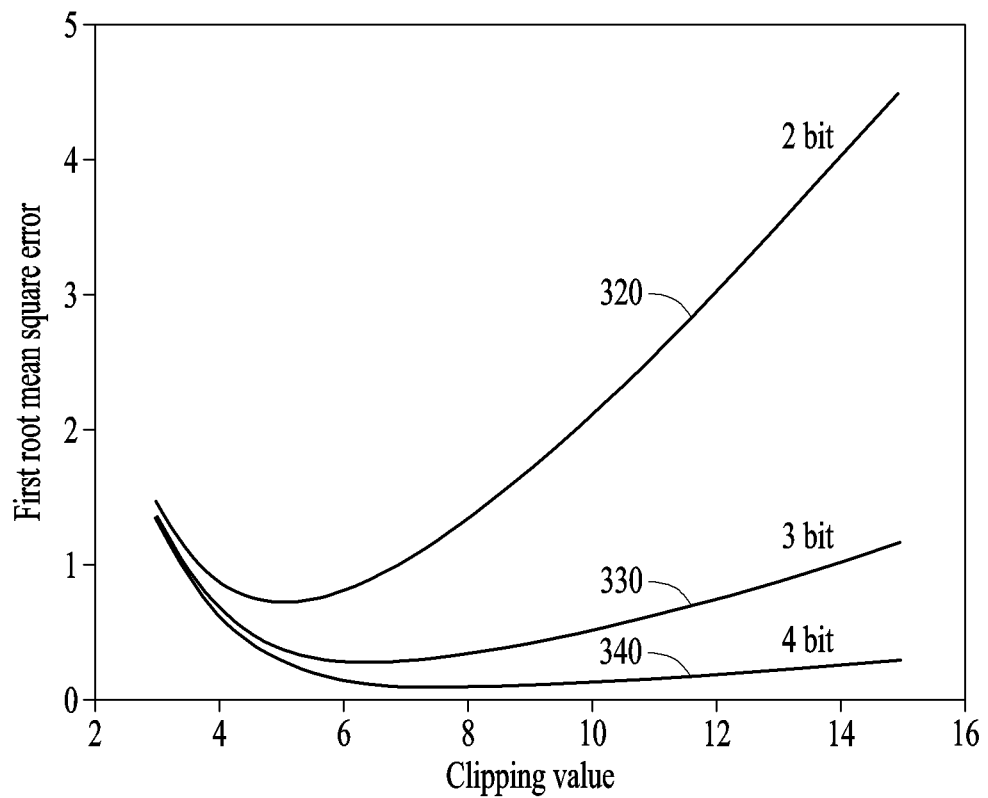
FIG. 3 illustrates a relationship between a clipping value and a first root mean square error reflecting a quantization error and a clipping error, according to one or more embodiments.

FIG. 3 illustrates a relationship between a clipping value and a first root mean square error reflecting a quantization error and a clipping error, according to one or more embodiments.

Generally, a clipping value of an ADC may be a maximum and a minimum quantization value output by the ADC. However, hereinafter, for brevity, description relating to the clipping value is based on the assumption that absolute value of the maximum quantization value is the same as the absolute value of the minimum quantization value, and the clipping value is the absolute value of the maximum or the minimum quantization value. Thus, the clipping value as discussed next is a scalar value that represents the size of the range from the minimum quantization value to the maximum quantization value.

As the clipping value of the ADC increases, the range between the maximum and the minimum quantization values may increase. When the number of bits used for the ADC and the quantization step size of the ADC are determined (or known), the clipping value of the ADC may be determined (or known) based thereon. When the number of bits used for the ADC is fixed, and when the quantization step size increases, the clipping value may increase. This is because when the number of bits output by the ADC is fixed the number of values to be quantized is also fixed. Conversely, when the number of bits output by the ADC is fixed, and when the quantization step size decreases, the clipping value may decrease. In other words, when the number of bits output by the ADC is fixed, the clipping value of the ADC may be proportional to the quantization step size of the ADC.

A first root mean square error may reflect both the quantization error and the clipping error for any given set of quantization parameters. For example, the first root mean square error may be represented by Equation 2 shown below.

$$\text{First } RMSE = \sum_{i=1}^{k} \sqrt{\frac{(\hat{x}_i - x_i)^2}{k}} \qquad \text{Equation 2}$$

In Equation 2, First RMSE denotes the first root mean square error, $\hat{x}^i$ denotes an actual value (e.g., an analog MAC result), $x^i$ denotes a result value (e.g., a converted digital value of the analog MAX result), and k denotes the number of result values. The range of the actual value $\hat{x}^i$ may not be limited.

Referring to FIG. 3, the graph 320 represents a relationship between the clipping value and the first root mean square error when the number of bits output by the ADC is two. A graph 330 represents a relationship between the first root mean square error and the clipping value when the number of bits used for the ADC is three. A graph 340 may represents a relationship between the first root mean square error and the clipping value when the number of bits used for the ADC is four. As shown by the graphs 320, 330, and 340, as the number of bits used for the ADC increases while the clipping value of the ADC is fixed, the first root mean square error decreases. In other words, as the number of bits used for the ADC increases, the first root mean square error decreases while the quantization step size of the ADC is fixed. Furthermore, there may be a clipping value that minimizes the first root mean square error while the number of bits used for the ADC is fixed. In other words, a quantization step size that minimizes the first root mean square error may exist while the number of bits used for the ADC is fixed.

Figure 4:
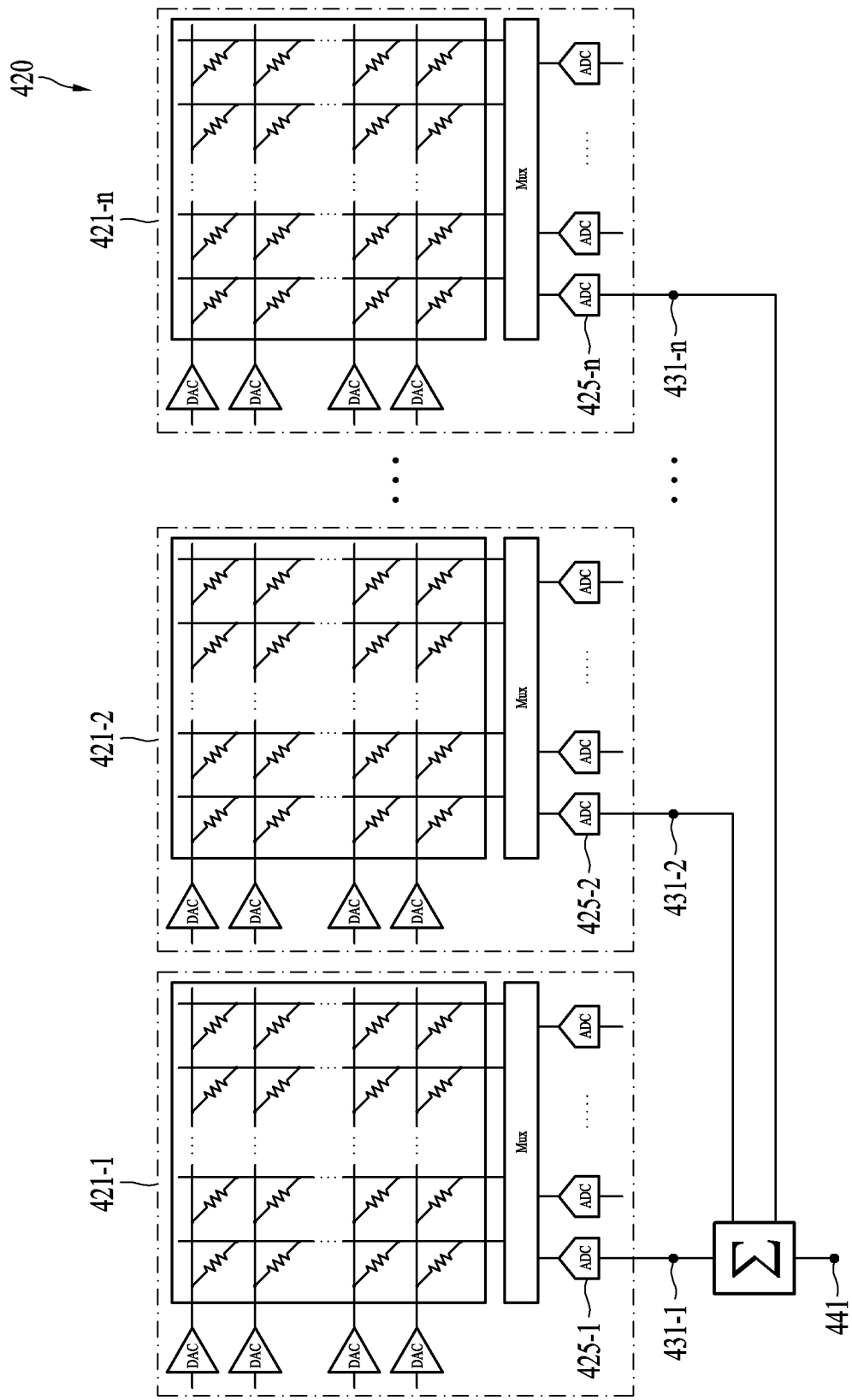
FIG. 4 illustrates an example computing device including a plurality of crossbar arrays, according to one or more embodiments.

FIG. 4 illustrates an example computing device 420 including a plurality of crossbar arrays, according to one or more embodiments. The example computing device 420 may perform a MAC operation for a target layer of a neural network through a plurality of crossbar arrays. The plurality of crossbar arrays may include crossbar arrays 421-1, 421-2, . . . , 421-n (where n is an integer greater than or equal to 2).

Output values respectively outputted by nodes of a layer preceding the target layer may be inputted as input values to the target layer. In this case, when the number of input values is large, it may not be possible to input all of the input values to the row lines of a single crossbar array (e.g., the crossbar array 421-1). In this case, the computing device 420 may handle the input values using a plurality of crossbar arrays. In other words, when the number of input values is greater than the number of row lines included in the crossbar array, all of the input values may not be input to a single crossbar array, and instead the computing device 420 may input all of the input values amongst the plurality of crossbar arrays (e.g., by splitting the input values).

For each of the crossbar arrays 421-1, 421-2, . . . , 421-n, the computing device 420 may determine an output corresponding to each node in the target layer by summing corresponding quantized result values respectively output by ADCs (e.g., an ADC 425-1, an ADC 425-2, . . . , an ADC 425-n) connected to corresponding column lines (e.g., a first column line).

That is to say, for each of the crossbar arrays 421-1, 421-2, . . . , 421-n, each of the quantized result values (e.g., MAC result values) respectively output by the ADCs (e.g., the ADC 425-1, the ADC 425-2, . . . , the ADC 425-n) connected to the corresponding column lines (e.g., the first column lines) may be referred to as a partial sum (e.g., a partial sum 431-1, a partial sum 431-2, . . . , a partial sum 431-n). In addition, for each of the crossbar arrays 421-1, 421-2, . . . , 421-n, an output value that is output by summing all of the partial sums (e.g., the partial sum 431-1, the partial sum 431-2, . . . , the partial sum 431-n) respectively output by the ADCs (e.g., the ADC 425-1, the ADC 425-2, . . . , the ADC 425-n) connected to the corresponding column lines (e.g., the first column lines) may be referred to as an accumulated sum (e.g., an accumulated sum 441).

For one partial sum (e.g., the partial sum 431-1) that is quantized by a corresponding ADC (e.g., ADC 425-1), a quantization step size of that ADC that minimizes a first RMSE of the one partial sum may be calculated. However, the quantization step size of the ADC that would minimize the first RMSE for the one partial sum may be different from the quantization step size of the ADC that would minimize the first root mean square error for an accumulated sum that includes the one partial sum (e.g., the accumulated sum 441). In other words, the quantization parameter(s) that minimize(s) quantization errors at the partial-sum level may not be the same as the quantization parameter(s) that minimize(s) quantization error of the accumulation of the partial sums.

Following is description of a method of the computing device 420 (including a plurality of crossbar arrays) to determine a quantization step size of an ADC that minimizes a first root mean square error for an accumulated sum (e.g., the accumulated sum 441).

Figure 5:
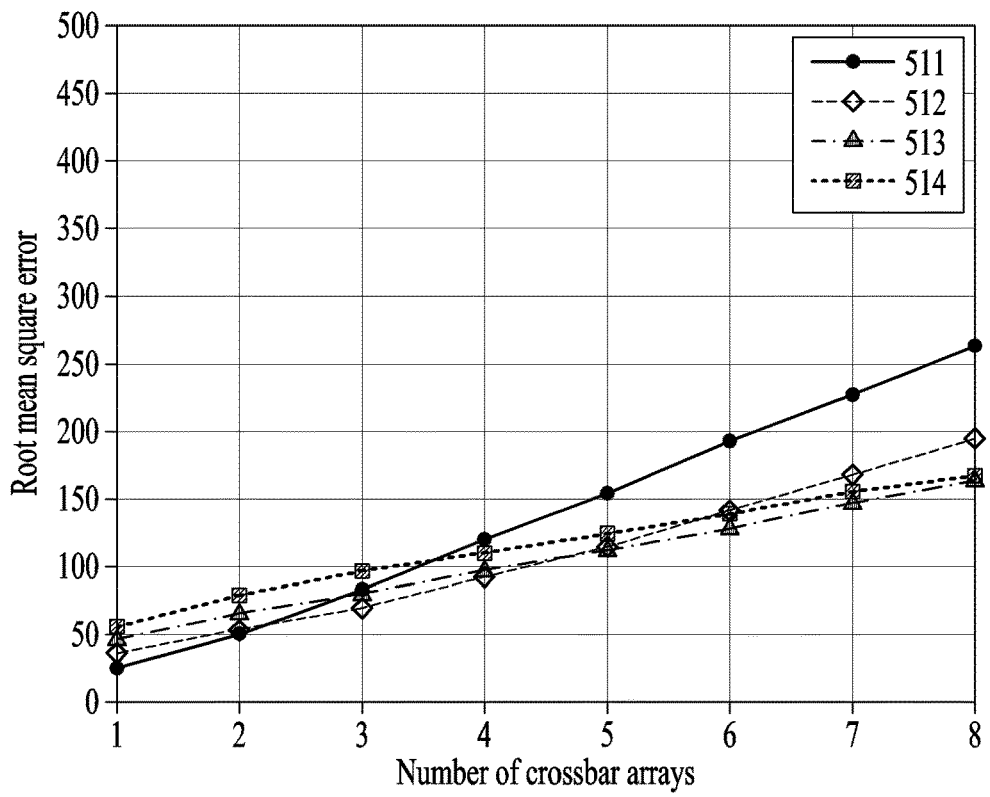
FIG. 5 illustrates a relationship between a first root mean square error reflecting a quantization error and a clipping error for an accumulated sum and the number of crossbar arrays included in a computing device, according to one or more embodiments.

FIG. 5 illustrates a relationship between a first root mean square error reflecting a quantization error and a clipping error for an accumulated sum and the number of crossbar arrays included in a computing device, according to one or more embodiments.

Referring to FIG. 5, a graph 511 shows a relationship between the number of crossbar arrays included in a computing device and a first root mean square error reflecting a quantization error and a clipping error for an accumulated sum (e.g., the accumulated sum 441 of FIG. 4) when a quantization step size of an ADC is, for example, 96 mV while the number of bits used for the ADC is fixed. Hereinafter, a unit of the quantization step size is omitted for ease of description (the step size may vary). Graphs 512, 513, and 514 represent relationships between the number of crossbar arrays included in the computing device (or the number that might be used for a given calculation) and the first RMSE when the quantization step sizes of the ADC are 126 mV, 160 mV, and 192 mV, respectively, while the number of bits used for each of the ADCs is fixed. Referring to the graphs of FIG. 5, while the quantization step size of the ADC is fixed, as the number of crossbar arrays included (or actively in use for a calculation) in the computing device increases, the value of the first RMSE also increases. This is because larger quantization and clipping errors arise in an accumulated sum in which partial sums of the crossbar array accumulate because each of the partial sums includes its own quantization error and clipping error.

In addition, as described with reference to FIG. 3, when the number of crossbar arrays included (or active) in the computing device is fixed, there may be a quantization step size of the ADC that minimizes the first RMSE. For example, referring to FIG. 5, when the number of crossbar arrays included/active in the computing device is one, the quantization step size of the ADC that minimizes the first RMSE for the accumulated sum may be 96. When the number of crossbar arrays included in the computing device is three, the quantization step size of the ADC that minimizes the first RMSE for the accumulated sum may be 126. The quantization step size of the ADC that minimizes the first root mean square error for the accumulated sum may vary based on the number of crossbar arrays included/active in the computing device.

Figure 6:
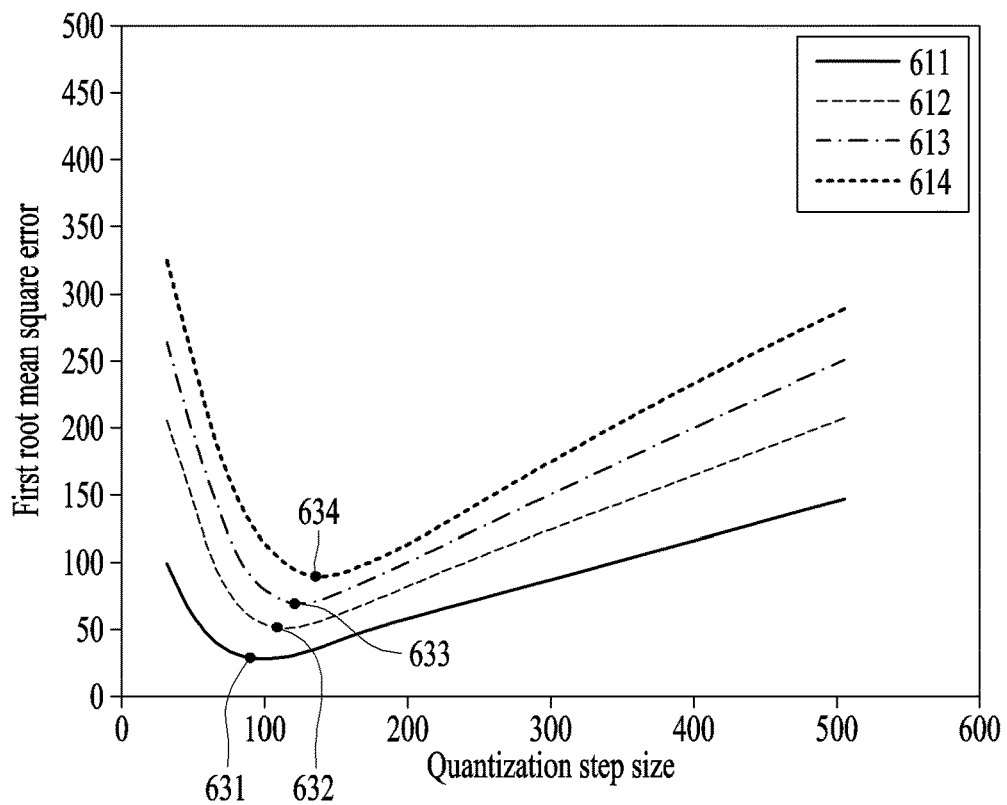
FIG. 6 illustrates a relationship between a quantization step size and a first root mean square error reflecting a quantization error and a clipping error for an accumulated sum, according to one or more embodiments.

FIG. 6 illustrates a relationship between a quantization step size and a first root mean square error reflecting a quantization error and a clipping error for an accumulated sum, according to one or more embodiments.

Referring to FIG. 6, when the number of crossbar arrays included/active in a computing device is one, a graph 611 shows a relationship between a quantization step size of an ADC and a first RMSE for an accumulated sum. Graphs 612, 613, and 614 represent relationships between the quantization step size and the first RMSE for an accumulated sum when the numbers of crossbar arrays included in the computing device are two, three, and four, respectively.

When the quantization step sizes of the respective ADCs are the same, the first RMSE for the accumulated sum may increase as the number of crossbar arrays included/active in the computing device increases. Point 631 represents a point on the graph 611 corresponding to the quantization step size that minimizes the first RMSE for the accumulated sum when the number of crossbar arrays included in the computing device is one. Points 632, 633, and 634 represent points on the graphs 612, 613, and 614 corresponding to the quantization step sizes that minimize the first RMSE for the accumulated sums when the numbers of crossbar arrays included/active in the computing device are two, three, and four, respectively.

When the number of bits used for the ADC is fixed, as the quantization step size decreases, the quantization error may decrease but the clipping error may increase. When the number of bits used for the ADC is fixed, as the quantization step size increases, the quantization error may increase but the clipping error may decrease. Accordingly, graphs 611, 612, 613, and 614, on the left sides thereof, the clipping error may have a greater influence than the quantization error, and on the right sides thereof, the quantization error may have a greater influence than the clipping error. The left sides of the graphs represent area where the first RMSE decreases in the graph and the right sides of the graphs represent areas where the first RMSE increases in the graph.

Generally, since it is difficult to calculate a graph relating quantization step size and the first RMSE for the accumulated sum, the computing device may estimate the quantization step size that minimizes the first RMSE for the accumulated sum through a method described below.

Figure 7:
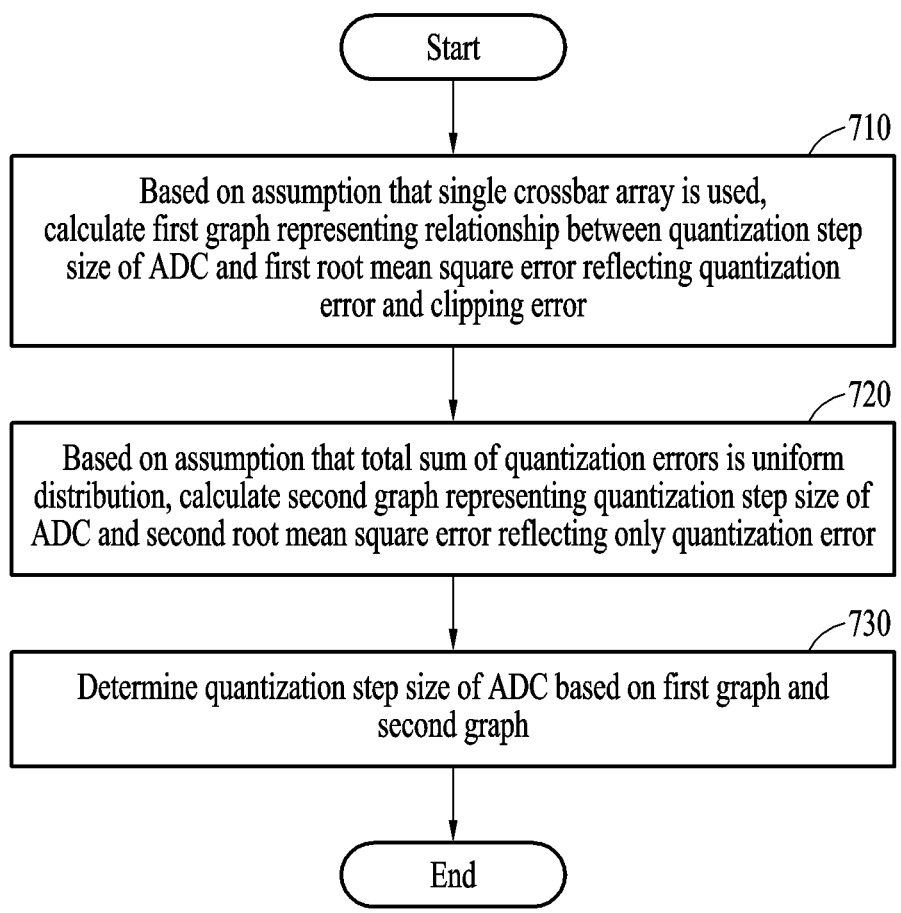
FIG. 7 illustrates an example method of optimizing a quantization step size of an analog-to-digital converter (ADC) based on the number of crossbar arrays included in a computing device, according to one or more embodiments.

FIG. 7 illustrates an example of a method of optimizing a quantization step size of an ADC based on the number of crossbar arrays included (or active) in a computing device.

According to an example, the computing device may include a plurality of crossbar arrays for performing a MAC operation for a target layer in a neural network. The computing device may include at least the minimum number of crossbar arrays where the minimum number of crossbar arrays is calculated based on the number of input values input to the target layer and the size of one crossbar array. For example, the size (e.g., 128×128) of a crossbar array included in the computing device may be expressed as a product of the number of row lines (e.g., 128) and the number of column lines (e.g., 128) included in the crossbar array. The computing device may include at least the number of crossbar arrays, which corresponds to a value obtained by dividing the number of input values input to the target layer by the number of row lines included in one crossbar array. For example, when the number of input values input to the target layer is 512 and the number of row lines included in a crossbar array included in the computing device is 128, the computing device may include at least four (512/128) crossbar arrays. In other words, the computing device needs to include or activate at least four crossbar arrays to perform a MAC operation in the target layer. Description hereinafter assumes that the computing device includes at least the minimum number of crossbar arrays required to perform a MAC operation in the target layer.

The computing device may include a processor, and the processor of the computing device may perform a process of determining a quantization step size of an ADC based on the number of crossbar arrays included (or used, activated, etc.) in the computing device. However, hereinafter, for ease of description, it is described that the computing device performs a series of processes.

In operation 710, based on an assumption that a single crossbar array is used, the computing device in an example may calculate a first graph representing a relationship between a quantization step size of an ADC and a first RMSE reflecting a quantization error and a clipping error. Although reference is made to a "graph", it will be understood that any information relating step sizes and first RMSEs. In other words, the "graphs" now described may be any form of information that maps step sizes to respectively corresponding first RMSEs.

For each of the crossbar arrays included in the computing device, the computing device may determine an output corresponding to one node in a target layer by an accumulated sum obtained by summing quantized partial sums respectively output by ADCs connected to corresponding column lines (e.g., the first column line). However, for each of the crossbar arrays included in the computing device, the computing device may calculate the first RMSE based on an assumption that an ADC connected to the corresponding column line is excluded and an ADC for quantizing a signal that sums analog signals output by the corresponding column line is added to calculate the first graph. In other words, the graph reflects a calculation where the partial sums are not quantized and the accumulated some thereof is quantized (and therefore has a first RMSE).

The computing device may calculate the first RMSE for the accumulated sum based on an assumption that a single crossbar array is used instead of a plurality crossbar arrays. The assumption that the computing device uses a single crossbar array may represent that, for each of the crossbar arrays included in the computing device, a quantized output value obtained by inputting a signal obtained by summing analog signals respectively output by corresponding column lines (e.g., the first column line) to one ADC is determined to be an output corresponding to one node in the target layer. In other words, for each of the crossbar arrays included in the computing device, the computing device may calculate the first graph based on calculation of the first RMSE for the quantized output value obtained by inputting a signal that sums analog signals respectively output by the corresponding column lines (e.g., the first column line) to one ADC.

According to an example, the computing device may calculate the first RMSE for the quantized output value (that is output when the single crossbar array is used) based on a quantization step size of the ADC, an output standard deviation of the single crossbar array, an output mean of the single crossbar array, and the number of bits used for the ADC. In other words, for each of the crossbar arrays, the computing device may calculate the first RMSE based on a difference between an actual value that needs to be sampled in a signal of a sum of analog signals and a quantized output value obtained by inputting, to an ADC, a signal of a sum of analog signals respectively output by corresponding column lines without quantizing.

According to an example, the computing device may calculate the first RMSE for a quantized output value that is output when the single crossbar array is used, based on Equation 3.

$$\text{First } RMSE = Q_0 \sqrt{ \frac{1}{12}\text{erf}\left(\frac{2^{M-1}Q_0 - \mu_N}{\sigma_N\sqrt{2}}\right) + 2\sigma_N^2\left(-\frac{2^{M-1}Q_0 - \mu_N}{\sigma_N\sqrt{2\pi}}e^{-\left(\frac{2^{M-1}Q_0-\mu_N}{\sigma_N\sqrt{2}}\right)^2}\right) + \left(\frac{1}{2} + \left(\frac{2^{M-1}Q_0-\mu_N}{\sigma_N\sqrt{2}}\right)^2\right)\left(1 - \text{erf}\left(\frac{2^{M-1}Q_0-\mu_N}{\sigma_N\sqrt{2}}\right)\right) }$$

Equation 3

In Equation 3, $Q_0$ denotes a quantization step size of an ADC, $\sigma_N$ denotes an output standard deviation of a single crossbar array, $\mu_N$ denotes an output mean of the single crossbar array, and M denotes the number of bits output by the ADC. The output standard deviation of the single crossbar array, the output mean of the single crossbar array, and the number of bits used for the ADC may be predetermined. In addition, the computing device may include an analog signal and sample data to which an actual value to be sampled in the analog signal is mapped and may calculate an output standard deviation of the single crossbar array and an output mean of the single crossbar array using the sample data. The aforementioned statistics may be determined in advance using test data, for example. Put another way, the statistics may be determined in advance empirically.

Accordingly, the computing device may calculate the first graph representing a relationship between the quantization step size $Q_0$ and the first RMSE (e.g., the first RMSE) based on Equation 3.

Figure 8:
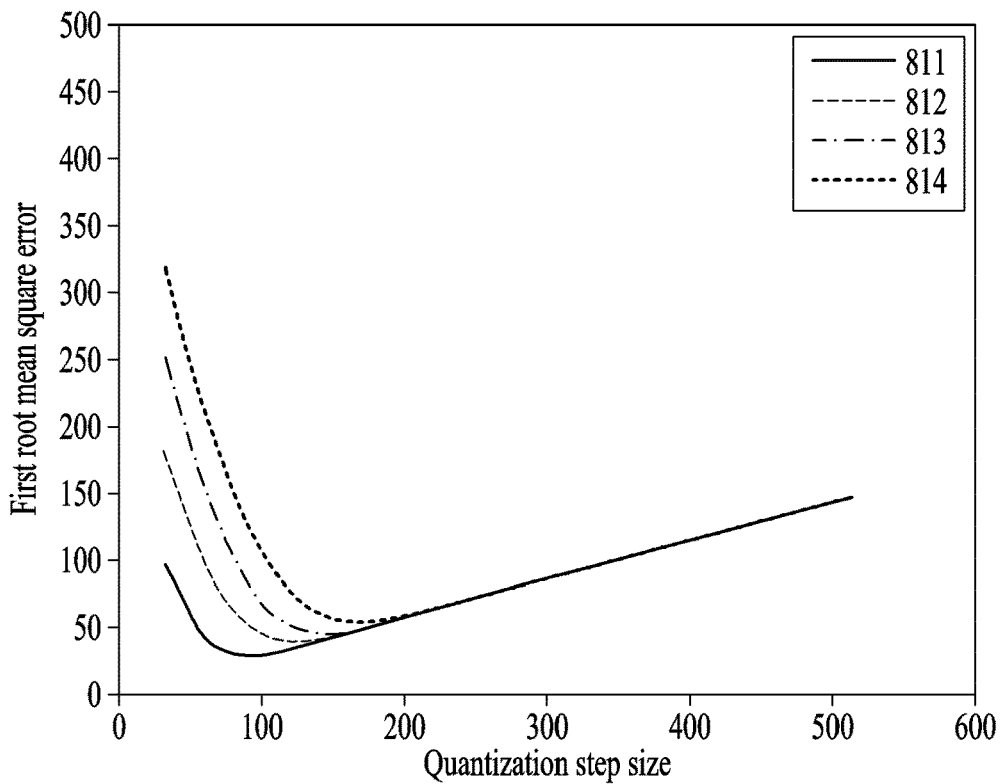
FIG. 8 illustrates first graphs calculated based on an assumption that a single crossbar array is used, according to one or more embodiments.

FIG. 8 illustrates first graphs calculated based on an assumption that a single crossbar array is used. Referring to FIG. 8, a first graph 811 represents the relationship between a quantization step size of an ADC and a first RMSE for a quantized output value that is output based on an assumption that a single crossbar array is used when the number of crossbar arrays included or used in the computing device is one. First graphs 812, 813, and 814 represent relationships between quantization step size of an ADC and a first RMSE for a quantized output value that is output based on an assumption that a single crossbar array is used when the numbers of crossbar arrays included in the computing device are two, three, and four, respectively. The left sides of the graphs 811, 812, 813, and 814 of FIG. 8 may be similarly illustrated on the left sides of the graphs 611, 612, 613, and 614 of FIG. 6 representing relationships between the quantization step size and the first RMSE for the accumulated sum. This is because, on the left sides of the graphs the clipping error has a greater influence than the quantization error. More specifically, when the computing device includes or uses the same number of crossbar arrays and the quantization step size of the ADC is the same, a clipping value in the case of assuming the use of a single crossbar array is the same as a clipping value in the case of not assuming the use of a single crossbar array, and thus, a clipping error in the case where the single crossbar array is used may be similarly calculated to a clipping error in the case where the single crossbar array is not used.

In addition, the right sides of the first graphs 811, 812, 813, and 814 of FIG. 8 may overlap into one graph as the quantization step size increases. This is because, on the right sides of the graphs the quantization error has a greater influence than the clipping error. More specifically, although the actual numbers of crossbar arrays included or used in the computing device may vary, when the single crossbar array is used, the quantized output value may be obtained by one quantization, and thus, the quantization error may be affected by the quantization step size independent of the actual number of crossbar arrays included in the computing device.

Referring to FIG. 7, in operation 720, the computing device may calculate a second graph representing the quantization step size of the ADC and a second RMSE reflecting only the quantization error for the accumulated sum based on an assumption that the total sum of quantization errors is a uniform distribution. As described above, the second RMSE may represent an error that only reflects a quantization error. The second RMSE for the accumulated sum may be expressed as Equation 4.

$$\text{Second } RMSE = \sum_{i=1}^{k} \sqrt{\frac{(\hat{y}_i - y_i)^2}{k}} \quad \text{Equation 4}$$

In Equation 4, the second RMSE denotes the second RMSE, $\hat{y}_i$ denotes an actual value, $y_i$ denotes a result value, and k denotes the number of result values. In this case, a range of the actual value $\hat{y}_i$ may be between a minimum quantization value and a maximum quantization value.

According to an example, when the total sum of quantization errors is a uniform distribution, due to a characteristic of the uniform distribution, the computing device may calculate the second RMSE for the accumulated sum based on the quantization step size of the ADC and the number of crossbar arrays included in the computing device. According to an example, the computing device may calculate the second RMSE for the accumulated sum when the total sum of quantization errors is a uniform distribution based on Equation 5.

$$\text{Second } RMSE = Q_0 \sqrt{\frac{n}{12}} \quad \text{Equation 5}$$

In Equation 5, $Q_0$ denotes the quantization step size of the ADC, and n denotes the number of crossbar arrays included in the computing device.

The second RMSE for the accumulated sum may be proportional to both a square root of the number (e.g., n) of crossbar arrays included/used in the computing device and the quantization step size of the ADC. The second RMSE for the accumulated sum may not be affected by the size of a partial sum (i.e., may be independent of the partial sum), which is a quantized result value output by a column line of a crossbar array. Since the number of crossbar arrays included or used in the computing device is known, the computing device may calculate the second graph representing the relationship between the quantization step size $Q_0$ and the second RMSE based on Equation 5.

According to an example, the computing device may calculate the second graph by a linear function of which the slope is a square root of a value obtained by dividing the number of crossbar arrays included in the computing device by 12.

In operation 730, the computing device may determine the quantization step size of the ADC based on the calculated first graph and the calculated second graph. According to an example, the computing device may determine the quantization step size of the ADC by identifying or determining which quantization step size corresponds to a point of intersection between the calculated first graph and the calculated second graph.

Figure 9:
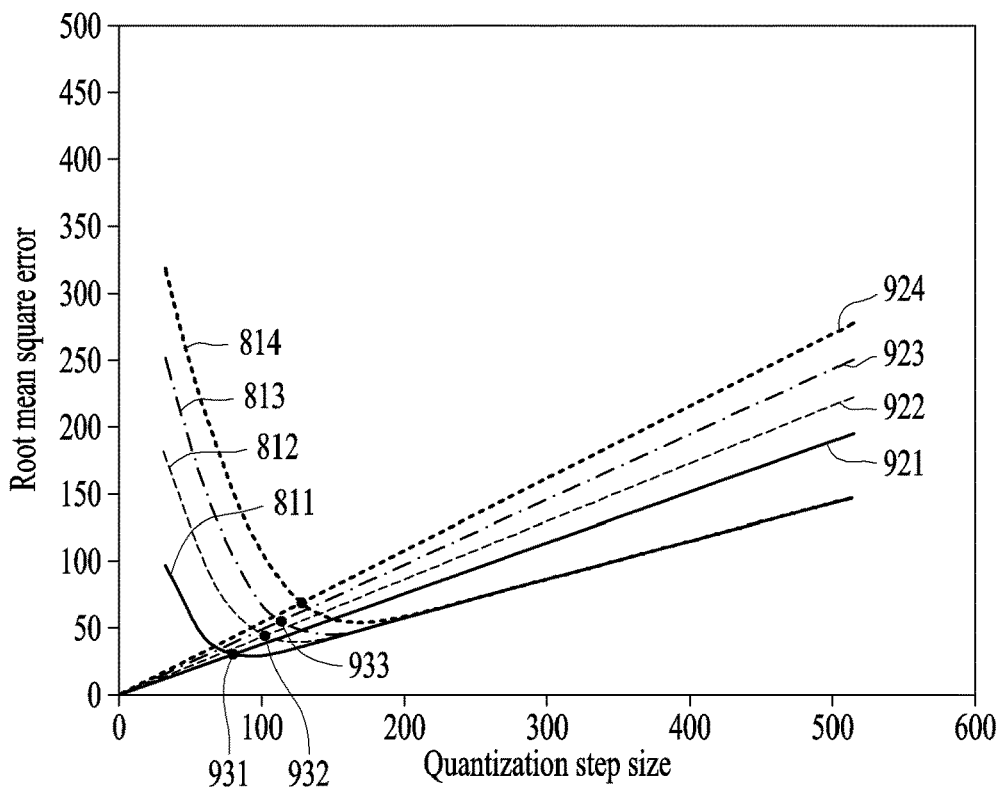
FIG. 9 illustrates an example of intersections between calculated first graphs and calculated second graphs, according to one or more embodiments.

FIG. 9 illustrates an example of intersections between calculated first graphs and calculated second graphs, according to one or more embodiments.

A computing device according to an example may determine a quantization step size of an ADC based on a calculated first graph and a calculated second graph. For a fixed number of crossbar arrays included/used in the computing device, the computing device may determine the quantization step size of the ADC to be the quantization step size corresponding to the point of intersection between the calculated first graph and the calculated second graph.

Referring to FIG. 9, a first graph (e.g., any of the first graphs 811, 812, 813, and 814) may overlap or intersect with a corresponding second graph. When the number of crossbar arrays included in the computing device is one, the second graph 921 represents a relationship between a quantization step size of an ADC and a second RMSE for an accumulated sum that is output based on an assumption that the total sum of quantization errors is a uniform distribution. Second graphs 922, 923, and 924 represent relationships between a quantization step size of an ADC and a second RMSE for an accumulated sum that is output based on an assumption that the total sum of quantization errors is a uniform distribution when the numbers of crossbar arrays included in the computing device are two, three, and four, respectively.

The computing device may determine the quantization step size of the ADC to be the quantization step size corresponding to an intersection between the first graph (corresponding to the number of crossbar arrays included in the computing device) and the second graph (corresponding to the number of crossbar arrays included in the computing device). For example, when the number of crossbar arrays included in the computing device is two, the computing device may determine the quantization step size of the ADC to be the quantization step size corresponding to an intersection point 932 where the first graph 812 intersects with the second graph 922. In another example, when the number of crossbar arrays included in the computing device is three, the computing device may determine the quantization step size of the ADC to be the quantization step size corresponding to an intersection point 933 where the first graph 813 intersects with the second graph 923. However, when the number of crossbar arrays included in the computing device is one and the quantization step size increases, the first graph 811 may be the same as the second graph 921, and thus, the computing device may determine the quantization step size of the ADC to be the quantization step size corresponding to the point with the smallest quantization step size among the intersection points where the first graphs intersect with the second graphs. For reference, including one crossbar array in the computing device may be the same as using a single crossbar array, and thus, when the quantization step size increases, the influence of quantization error may be greater than the influence of clipping error and the right side of the first graph 811 corresponding to one crossbar array may be the same as the second graph 921.

As described above, the left side of a first graph based on an assumption that a single crossbar array is used may be similar to the left side of the graph of FIG. 6 representing the relationship between the quantization step size and the first RMSE for the accumulated sum. In addition, a second graph, which is a linear function representing a relationship between the quantization step size of the ADC and the second RMSE for the accumulated sum, may be an asymptote of the graph of FIG. 6 representing the relationship between the quantization step size and the first RMSE for the accumulated sum. Consequently, the quantization step size corresponding to an intersection point where the first graph (corresponding to the number of crossbar arrays included in the computing device) intersects with the second graph may be similar to the quantization step size that minimizes the first RMSE for the accumulated sum. Accordingly, to minimize the first RMSE, the computing device may determine the quantization step size of the ADC to be the quantization step size corresponding to the intersection point of the first graph (corresponding to the number of crossbar arrays included in the computing device) and the second graph.

Furthermore, as the number of crossbar arrays included in the computing device increases, the quantization step size of the ADC determined by the computing device may increase. Referring to FIG. 9, as the number of crossbar arrays included in the computing device increases, the quantization step size corresponding to the intersection point may also increase.

Figure 10:
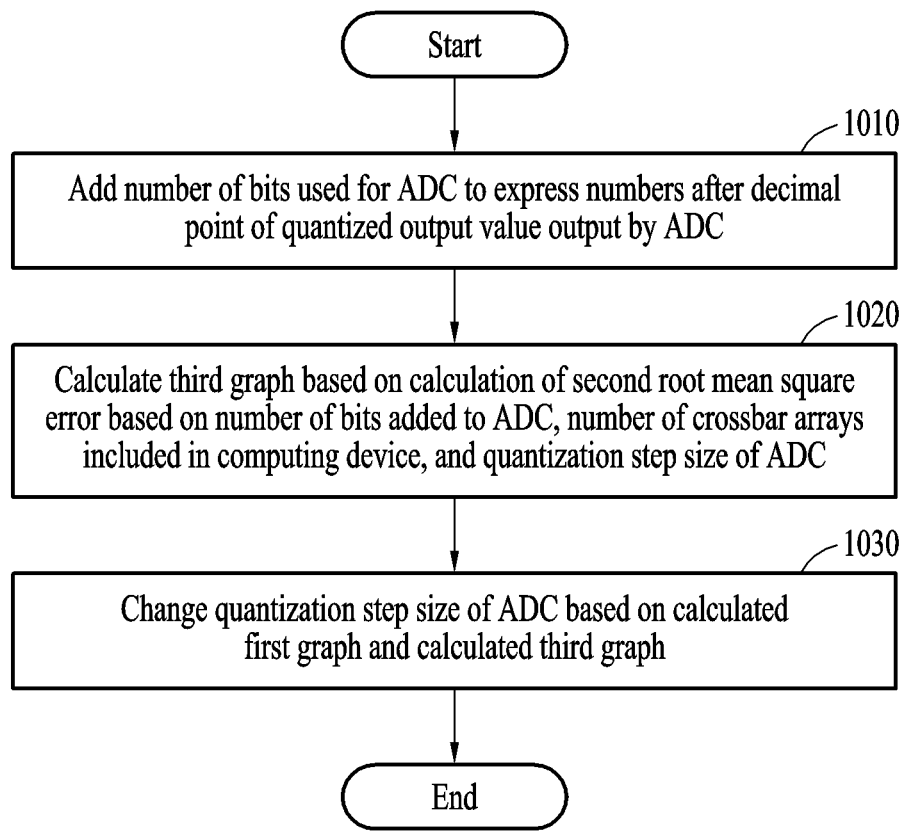
FIG. 10 illustrates an example of changing a quantization step size of an ADC that is optimized when the number of bits used for the ADC is added.

FIG. 10 illustrates an example of changing a quantization step size of an ADC that is optimized when the number of bits used for the ADC is added, according to one or more embodiments.

In operation 1010, for an ADC that quantizes an analog signal output by a column line of a crossbar array included in a computing device, the computing device may add the number of bits used for the ADC to express numbers after a decimal point of a quantized output value output by the ADC.

In other words, the computing device may add the number of bits used for the ADC that quantizes an analog signal output by a column line of a crossbar array, and the number of bits added to the ADC may be used to express numbers after a decimal point of a quantized output value (e.g., a partial sum) output by the ADC. For each of crossbar arrays, the computing device may calculate an accumulated sum by adding partial sums respectively output by ADCs connected to corresponding column lines and rounding off the first decimal place.

When the number of bits added to the ADC is infinite, precision may be maximized, and thus, it may be the same as not quantizing an analog signal and a result may be the same as using a single crossbar array as illustrated in the graph of FIG. 8.

In an example, the computing device may change a quantization step size of the ADC based on the number of bits added to the ADC. The computing device may change the quantization step size of the ADC through operations 1020 and 1030 described next.

In operation 1020, the computing device may calculate a third graph representing a relationship between a second RMSE and the quantization step size of the ADC by calculating the second RMSE based on the quantization step size of the ADC, the number of crossbar arrays included in the computing device, and the number of bits added to the ADC.

When the number of bits used for the ADC is added to express numbers after a decimal point of a quantized output value output by the ADC, the computing device may calculate the third graph representing a relationship between a second RMSE for an accumulated sum and the quantization step size of the ADC by considering the number of bits added to the ADC. In this case, the total sum of quantization errors may be assumed to have a uniform distribution. In an example based on Equation 6 below, the computing device may calculate the second RMSE for the accumulated sum calculated by a plurality of crossbar arrays as the number of bits used for the ADC is added.

$$\text{Second } RMSE = Q_0 \sqrt{a_k + b_k + c_k} \quad \text{Equation 6}$$

$$a_k = \frac{n}{12} \frac{1}{2^{3k}}, \; b_k = a_k + \frac{1}{2^{k+2}},$$

$$c_k = a_k(2^k - 2) + \frac{1}{12}\left(1 - \frac{1}{2^k}\right)\left(1 - \frac{1}{2^k}\right)$$

In Equation 6, $Q_0$ denotes the quantization step size of the ADC, n denotes the number of crossbar arrays included in the computing device, and k denotes the number of bits added to the ADC.

Since the number of crossbar arrays included in the computing device and the number of bits added to the ADC are known, the computing device may calculate the third graph representing the relationship between the second RMSE (e.g., the second RMSE) and the quantization step size (e.g., $Q_0$) based on Equation 6. The calculated third graph may be a linear function that differs from the second graph.

In operation 1030, the computing device may change the quantization step size of the ADC based on the calculated first graph and the calculated third graph. In an example, the computing device may determine the quantization step size of the ADC to be a quantization step size corresponding to an intersecting point of the calculated first graph and the calculated third graph.

Figure 11:
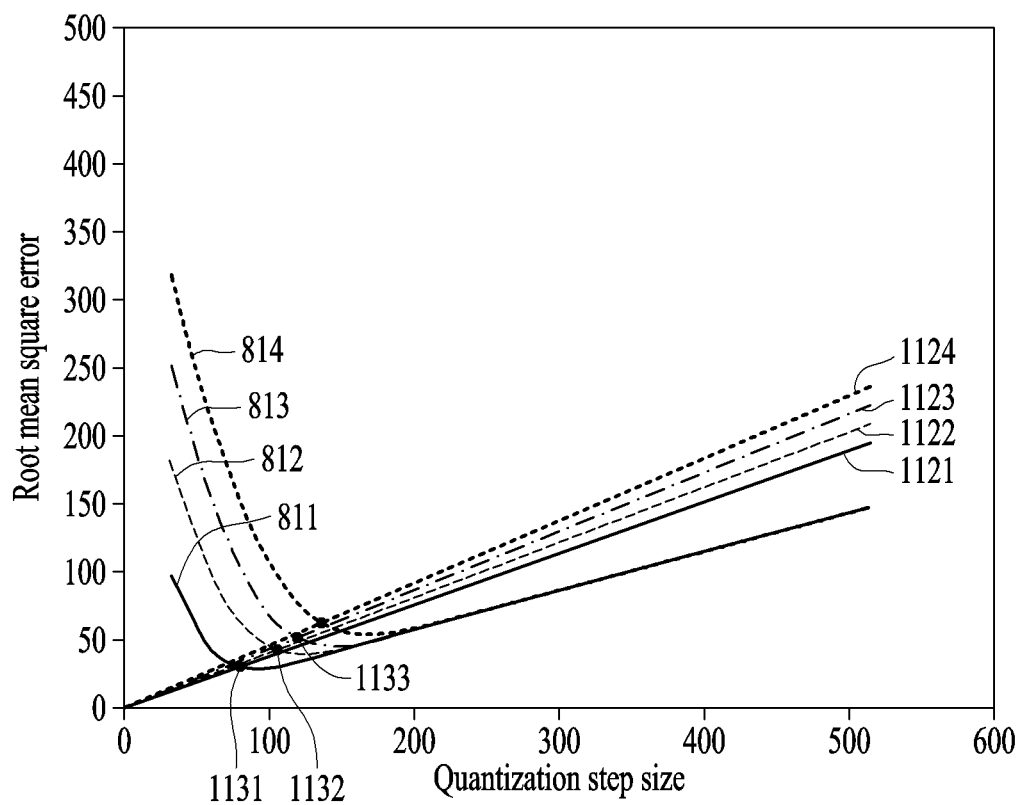
FIG. 11 illustrates an example of intersecting a calculated first graph and a calculated third graph, according to one or more embodiments.

FIG. 11 illustrates an example of intersecting a calculated first graph and a calculated third graph, according to one or more embodiments.

A computing device in an example may change a quantization step size of an ADC based on a calculated first graph and a third graph. When the number of crossbar arrays included or used in the computing device is fixed, the computing device may change the quantization step size of the ADC to the quantization step size corresponding to the intersection point of the first graph and the third graph.

Referring to FIG. 11, the third graph may overlap with the first graph (e.g., any of the first graphs 811, 812, 813, and 814) representing the relationship between the quantization step size of the ADC and the first RMSE. When the single crossbar array is used, even if bits are added to the ADC, a quantized output value may be obtained through inputting a signal obtained by summing analog signals respectively output by column lines to one ADC, and thus, the first RMSE for the output value may not change. Accordingly, the computing device may use the calculated first graph in the same manner.

A third graph 1121 represents a relationship between the quantization step size of the ADC and the second RMSE for an accumulated sum that is output based on an assumption that the total sum of quantization errors is uniformly distributed when the number of bits added to the ADC is one and the number of crossbar arrays included in the computing device is one. Third graphs 1122, 1123, and 1124 represent relationships between the quantization step size of the ADC and the second RMSE for the accumulated sum that is output based on an assumption that the total sum of quantization errors is uniformly distributed when the number of bits added to the ADC is one and the numbers of crossbar arrays included in the computing device are two, three, and four, respectively.

The computing device may change the quantization step size of the ADC to a quantization step size corresponding to the intersection point of the first graph (corresponding to the number of crossbar arrays included in the computing device) and the third graph (corresponding to the number of crossbar arrays included in the computing device).

The computing device may add one bit to the ADC. For example, when the number of crossbar arrays included in the computing device is two, the computing device may determine the quantization step size of the ADC to be a quantization step size corresponding to intersection point 1132 where the first graph 812 intersects with the third graph 1122. In another example, when the number of crossbar arrays included in the computing device is three, the computing device may determine the quantization step size of the ADC by a quantization step size corresponding to an intersecting point 1133 where the first graph 813 intersects with the third graph 1123. However, when the number of crossbar arrays included in the computing device is one and the quantization step size increases, the first graph 811 may be the same as the third graph 1121, and thus, the computing device may determine the quantization step size of the ADC to be a quantization step size corresponding to the point with the smallest quantization step size among intersection points where the first graph 811 intersects with the third graph 1121. For reference, including one crossbar array in the computing device may be the same as using a single crossbar array, and thus, when the quantization step size increases, the influence of quantization error may be greater than an influence of clipping error and the first graph 811 corresponding to one crossbar array may be the same as the third graph 1121.

The computing apparatuses, the electronic devices, the processors, the memories, the information output system and hardware, the storage devices, and other apparatuses, devices, units, modules, and components described herein with respect to FIGS. 1-11 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-11 that perform the operations described in this application are performed by computing hardware, for example, by one or more processors or computers, implemented as described above implementing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A method of optimizing a quantization step size of an analog-to-digital converter (ADC) based on a number of crossbar arrays of a computing device, the method comprising:
    generating a first mapping relationship between the quantization step size of the ADC and a first root mean square error, the first root mean square error reflecting a quantization error and a clipping error, wherein the generating the first mapping relationship is based on use of only a single crossbar array;
    generating a second mapping relationship between the quantization step size of the ADC and a second root mean square error, the second root mean square error reflecting a quantization error, wherein the generating the second mapping is based on a uniform distribution of a total sum of quantization errors; and
    determining the quantization step size of the ADC based on the first mapping relationship and the second mapping relationship.

2. The method of claim 1, wherein the computing device comprises the crossbar arrays and the crossbar arrays perform a multiply and accumulate (MAC) operation for a layer in a neural network.

3. The method of claim 1, wherein the generating the first mapping relationship comprises, for each of the crossbar arrays of the computing device, generating the first mapping relationship based on calculation of a first root mean square error for a quantized output value obtained by inputting, to an ADC, a signal obtained by summing analog signals respectively output from corresponding column lines of the crossbar array.

4. The method of claim 1, wherein the generating the first mapping relationship comprises calculating the first root mean square error based on the quantization step size of the ADC, an output standard deviation of a single crossbar array, an output mean of the single crossbar array, and a number of bits outputted by the ADC.

5. The method of claim 1, wherein the generating the second mapping relationship comprises
    calculating the second root mean square error based on the quantization step size of the ADC and the number of crossbar arrays of the computing device.

6. The method of claim 5, wherein the generating the second mapping relationship comprises calculating the second mapping relationship by a linear function of which a slope is a square root of a value obtained by dividing the number of crossbar arrays comprised in the computing device by 12.

7. The method of claim 1, wherein the determining of the quantization step size of the ADC is determined based on an intersection point of the calculated first mapping relationship and the calculated second mapping relationship.

8. The method of claim 7, wherein as the number of crossbar arrays of the computing device increases, the determined quantization step size of the ADC increases.

9. The method of claim 1, further comprising:
for an ADC quantizing an analog signal output by a column line of a crossbar array comprised in the computing device, adding a number of bits to the ADC to express numbers after a decimal point of a quantized output value that is output by the ADC; and
changing the quantization step size of the ADC based on the number of bits added to the ADC.

10. The method of claim 9, wherein the changing of the quantization step size of the ADC comprises:
calculating a third mapping relationship between the quantization step size of the ADC and the second root mean square error by calculating the second root mean square error based on the quantization step size of the ADC, the number of crossbar arrays comprised in the computing device, and the number of bits added to the ADC; and
changing the quantization step size of the ADC based on the first mapping relationship and the third mapping relationship.

11. The method of claim 10, wherein the third mapping relationship corresponds to a linear function and differs from the calculated second mapping relationship.

12. A computing device comprising:
crossbar arrays;
analog-to-digital converters (ADCs) respectively connected to column lines of the plurality of crossbar arrays; and
a processor configured to:
generate a first mapping relationship between a quantization step size of an ADC and a first root mean square error, wherein the first root mean square error reflects a quantization error and a clipping error, and wherein the generating the first mapping relationship is based on use of a single crossbar array,
generate a second mapping relationship between the quantization step size of the ADC and a second root mean square error, wherein the second root mean square error reflects a quantization error, and wherein the generating the second mapping relationship is based on a uniform distribution of a total sum of quantization errors, and
determine the quantization step size of the ADC based on the first mapping relationship and the second mapping relationship.

13. The computing device of claim 12, wherein the computing device is configured to use the crossbar arrays to perform a multiply and accumulate (MAC) operation in a layer of a neural network.

14. The computing device of claim 12, wherein the processor is further configured to, for each of the crossbar arrays, calculate the first mapping relationship based on calculation of a first root mean square error for a quantized output value obtained by inputting, to an ADC, a signal obtained by summing analog signals respectively output from corresponding column lines of the crossbar arrays.

15. The computing device of claim 12, wherein the processor is further configured to calculate the first root mean square error based on the quantization step size of the ADC, an output standard deviation of the single crossbar array, an output mean of the single crossbar array, and a number of bits used for the ADC.

16. The computing device of claim 12, wherein the processor is further configured to calculate the second root mean square error based on the quantization step size of the ADC and a number of crossbar arrays of the computing device.

17. The computing device of claim 16, wherein the processor is further configured to calculate the second mapping relationship by a linear function of which a slope is a square root of a value obtained by dividing the number of crossbar arrays of the computing device by 12.

18. The computing device of claim 12, wherein the processor is further configured to determine the quantization step size of the ADC by a quantization step size corresponding to an intersection point of the first mapping relationship and the second mapping relationship.

19. The computing device of claim 18, wherein as the number of crossbar arrays of the computing device increases, the determined quantization step size of the ADC increases.

20. The computing device of claim 14, wherein the processor is further configured to, for an ADC quantizing an analog signal output by a column line of a crossbar array of the computing device, add a number of bits to the ADC to express numbers after a decimal point of a quantized output value that is output by the ADC, and change the quantization step size of the ADC based on the number of bits added to the ADC.

* * * * *